(12) United States Patent
Scholten et al.

(10) Patent No.: US 8,848,169 B2
(45) Date of Patent: Sep. 30, 2014

(54) LITHOGRAPHIC APPARATUS, COMPOSITE MATERIAL AND MANUFACTURING METHOD

(75) Inventors: Mark Scholten, Einighausen (NL); Jacob Kleijn, Winteire (NL); Stephan Christiaan Quintus Libourel, Veldhoven (NL); Mark Petrus Ubbink, Apeldoorn (NL)

(73) Assignee: ASML Netherlands B.V., Veldhoven (NL)

( * ) Notice: Subject to any disclaimer, the term of this patent is extended or adjusted under 35 U.S.C. 154(b) by 643 days.

(21) Appl. No.: 12/466,931

(22) Filed: May 15, 2009

(65) Prior Publication Data

US 2009/0310114 A1 Dec. 17, 2009

Related U.S. Application Data

(60) Provisional application No. 61/129,220, filed on Jun. 12, 2008.

(51) Int. Cl.
 *G03B 27/58* (2006.01)
 *G03B 27/62* (2006.01)
 *G03F 7/20* (2006.01)

(52) U.S. Cl.
 CPC .......... *G03F 7/70716* (2013.01); *G03F 7/7095* (2013.01)
 USPC .............................................. 355/72; 355/75

(58) Field of Classification Search
 USPC .................... 355/53, 72, 74, 75, 77
 See application file for complete search history.

(56) References Cited

U.S. PATENT DOCUMENTS

| | | | |
|---|---|---|---|
| 5,253,012 A * | 10/1993 | Chiba et al. | 355/53 |
| 5,866,272 A * | 2/1999 | Westre et al. | 428/593 |
| 5,939,213 A | 8/1999 | Bowden et al. | |
| 7,196,768 B2 | 3/2007 | Ottens et al. | |
| 7,397,534 B2 | 7/2008 | Iwata et al. | |
| 2001/0052970 A1* | 12/2001 | Sato | 355/72 |
| 2004/0031932 A1* | 2/2004 | Vosters et al. | 250/492.1 |
| 2005/0007574 A1* | 1/2005 | Van Der Meulen et al. | 355/72 |
| 2005/0269525 A1* | 12/2005 | Terken et al. | 250/492.2 |
| 2007/0216892 A1* | 9/2007 | Eidelberg | 355/72 |

FOREIGN PATENT DOCUMENTS

| | | |
|---|---|---|
| CN | 1766739 A | 5/2006 |
| JP | 2005-111656 A | 4/2005 |
| JP | 2007-191148 | 8/2007 |
| KR | 20060009957 A | 2/2006 |
| TW | 200424781 | 11/2004 |
| WO | WO 2008019860 A1 * | 2/2008 |

OTHER PUBLICATIONS

Office action in related Korean patent application No. 10-2009-0051877 dated Jan. 10, 2011.

(Continued)

*Primary Examiner* — Glen Kao
(74) *Attorney, Agent, or Firm* — Pillsbury Winthrop Shaw Pittman LLP

(57) ABSTRACT

A lithographic apparatus includes an illumination system configured to condition a radiation beam and a support constructed to support a patterning device. The patterning device may be capable of imparting the radiation beam with a pattern in its cross-section to form a patterned radiation beam. The lithographic apparatus further includes a substrate table constructed to hold a substrate and a projection system configured to project the patterned radiation beam onto a target portion of the substrate. The lithographic apparatus may be provided with a composite material wherein a layer of carbon fiber and a layer of titanium is provided within the composite.

20 Claims, 3 Drawing Sheets

(56) References Cited

OTHER PUBLICATIONS

Axel Fink et al, "Hybrid Titanium Composite Material Improving Composite Structure Coupling", European Conference on Spacecraft Structures, Materials & Mechanical Testing, (2005), pp. 1-6.

Office Action in related Chinese application No. 200910142675.9 issued Jan. 26, 2011.
Office Action in related application No. JP2009-135671 mailed Jul. 21, 2011.
Taiwan Office Action dated Feb. 25, 2013 in corresponding Taiwan Patent Application No. 098117541.

* cited by examiner

LITHOGRAPHIC APPARATUS, COMPOSITE MATERIAL AND MANUFACTURING METHOD

CROSS REFERENCE TO RELATED APPLICATIONS

This application claims priority and benefit under 35 U.S.C. §119(e) to U.S. Provisional Patent Application No. 61/129,220, entitled "Lithographic Apparatus, Composite Material and Manufacturing Method", filed on Jun. 12, 2008. The content of that application is incorporated herein in its entirety by reference.

FIELD

The present invention relates to a lithographic apparatus and methods.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Within the lithographic apparatus moveable parts may be used. For example, the support and/or the substrate table may be moveable. Forces may be exerted on the moveable parts by a positioning device. Metals such as steel and aluminum have been used for the moveable part and the positioning device. However, metals may have a high weight.

SUMMARY

It is desirable to provide an improved material or at least an alternative for metal.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; wherein a component of the lithographic apparatus includes a composite material, the composite material includes a layer of carbon fiber and a layer of titanium.

In another embodiment of the invention, there is provided a composite material including a layers of a carbon fiber, wherein a layer of titanium is provided within the composite.

According to an embodiment of the invention, there is provided a method of making a composite material including: providing a carbon fiber layer; providing a titanium layer; and, pressing the layers together.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
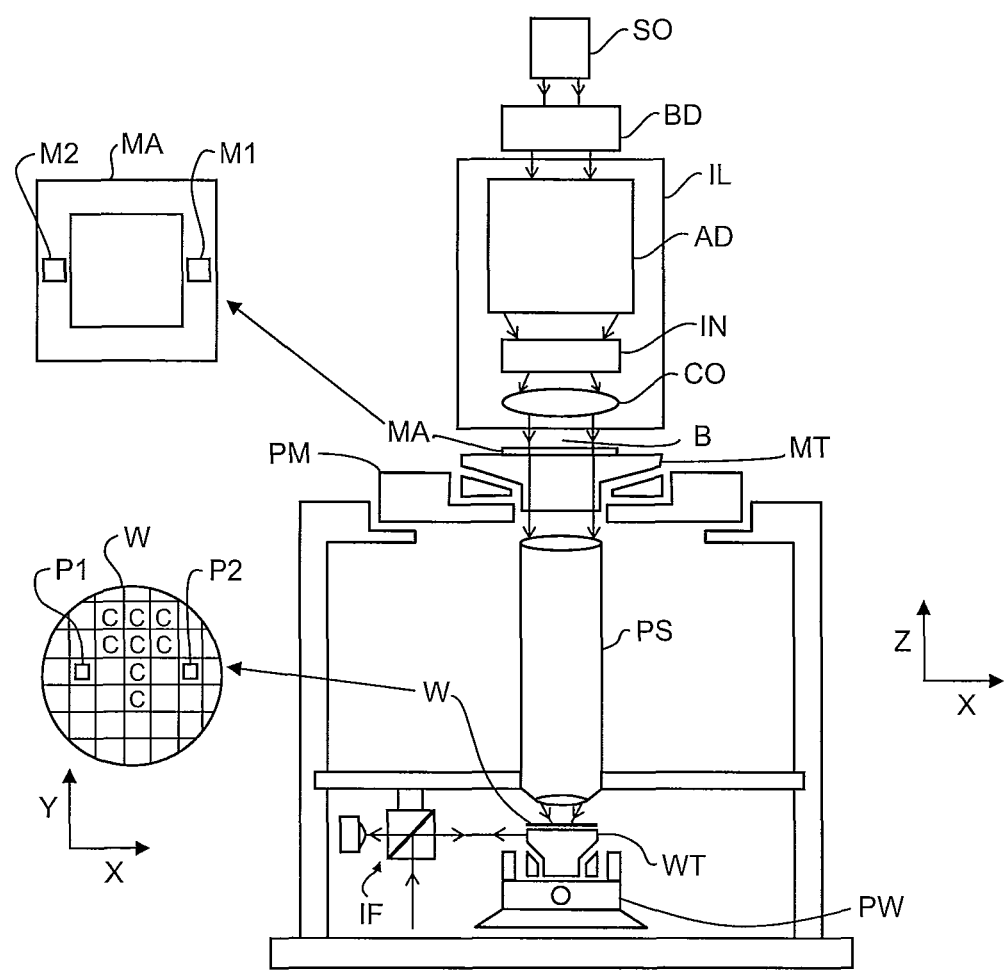
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support"

relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

An embodiment of the invention includes a lithographic apparatus including a support constructed to support a patterning device, the patterning device being capable of imparting a radiation beam with a pattern in its cross-section to form a patterned radiation beam; a substrate table constructed to hold a substrate; a projection system configured to project the patterned radiation beam onto a target portion of the substrate, wherein a component of the lithographic apparatus comprises a composite material, the composite material includes a layer of carbon fiber and a layer of titanium. The term "component", as used herein, is intended to encompass any part of the apparatus, e.g. a substrate table, a patterning device support, a crash protector. The term "component" is also intended to encompass a portion of a part, such as, e.g., a surface of a substrate table.

Figure 2:
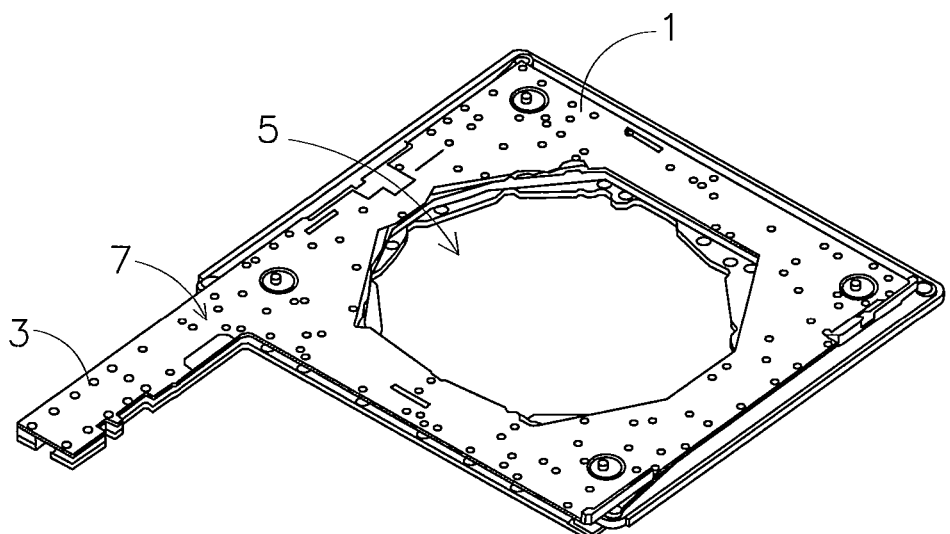
FIG. 2 depicts a crash protector of the lithographic apparatus according to an embodiment of the invention.

FIG. 2 depicts a crash protector of the lithographic apparatus in accordance with an embodiment of the invention. The crash protector is a moveable part that is used to protect a moveable part during a power break down or a failure of a control system. The crash protector may be used to protect a moveable substrate table (WT in FIG. 1) which may be mounted in the open space 5. The extension 3 may be used to limit rotations around an axis substantially perpendicular to the main plane 1 of the crash protector. The extension 3 may be provided with protrusions (not shown) which are guided through a groove (not shown). In case of a loss of control in the rotational direction of the crash protector, the groove may exert via the protrusions and the extension 3 a rotational force on the crash protector, which gives a very high peak stress in an inside corner 7.

Figure 3:
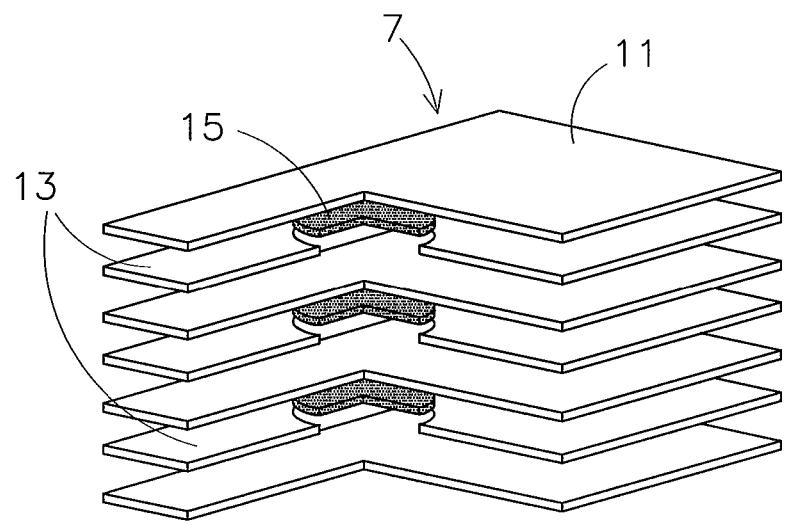
FIGS. 3 and 4 depict the inside corner 7 of the crash protector of FIG. 2 in more detail according to an embodiment of the invention.
Figure 4:
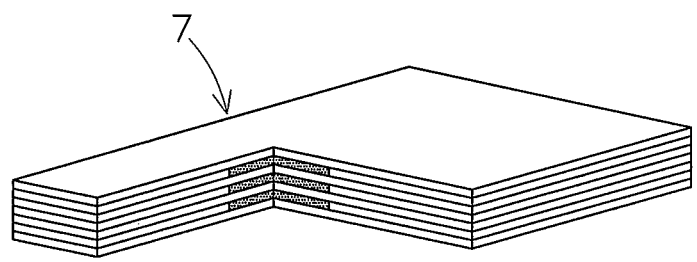

FIGS. 3 and 4 depict the inside corner 7 of the crash protector of FIG. 2 in more detail, in accordance with an embodiment of the invention. The inside corner 7 is constructed from a composite material including alternating layers of carbon fibers 11 and titanium 15. The titanium layer may be provided to the inside corner or other places where high stresses occur. If the titanium layer is not needed to reduce stress in the whole inside corner, the titanium layer 15 may be smaller than the carbon layer 11. The locations 13 where there is no titanium layer 15 may be filled with an additional carbon layer or with a filler material. The titanium layer may have a thickness of about 0.01 to 1 mm, more preferably about 0.1 mm. The titanium may preferably be titanium grade 5 in an embodiment of the invention. The different layers shown in FIG. 3 will be pressed together to form the inside corner 7 of FIG. 4. In FIGS. 3 and 4, four carbon fiber layers 11 are alternating with three titanium layers 15, however the composite can also be used with additional alternating layers of carbon fibers and titanium. The layer of titanium may be provided as a rectangular plate of titanium from which a corner is cut out to form the inside corner of the composite. A benefit of the composite is that it is insensitive for magnetic forces and that carbon provides a good damping of vibrations. The use of carbon fibers also gives a very high strength over the density, which makes it possible to make a very strong and lightweight design.

Figure 5:
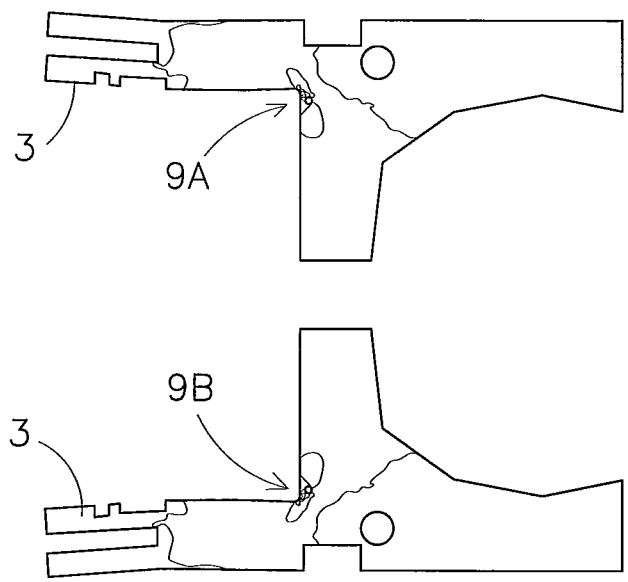
FIG. 5 shows the stress within a part of the crash protector of FIG. 2 when a crash is occurring and no titanium layers are provided in between the carbon layers; and, FIG. 6 shows the stress within a part of the crash protector of FIG. 2 when a crash is occurring and titanium plates are provided on some parts in between the carbon layers.

FIG. 5 shows the stress within a part of the crash protector of FIG. 2 when a crash is occurring and no titanium layers are provided in between the carbon layers. A top view is given of the stresses in the crash protector in the upper part of FIG. 5 and a bottom view of the stresses in the crash protector is given in the bottom part of FIG. 5. FIG. 5 shows that very high peak stresses occur in the inside corner 9A and 9B as a crash occurs and no titanium layers are present.

Figure 6:
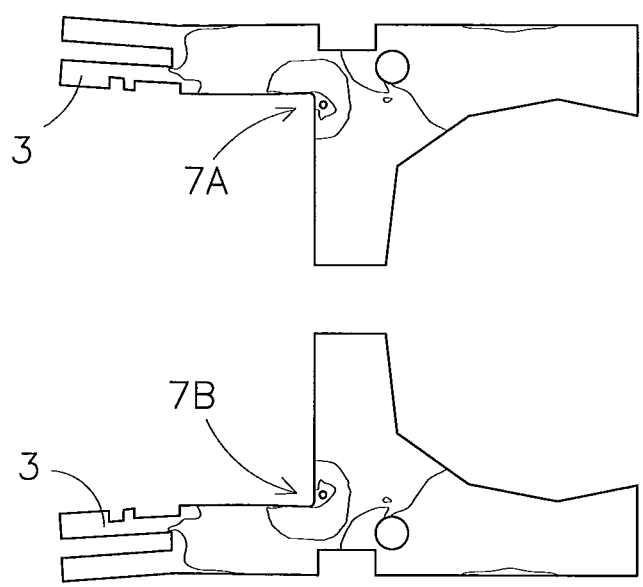

FIG. 6 shows the stress within a part of the crash protector of FIG. 2 when a crash is occurring and titanium plates are provided partially in between the carbon layers. A top view is given of the stresses in the crash protector in the upper part of FIG. 6 and a bottom view of the stresses in the crash protector is given in the bottom part of FIG. 6. A comparison of FIG. 6 with FIG. 5 shows that lower peak stresses occur in the inside corner 7A and 7B when a crash occurs and titanium plates are present in the inside corner. The lower peak stresses and the titanium having a better stress criterion than the carbon layers makes that the crash protector can withstand a crash better.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of the composite material in the context of optical lithography, it will be appreciated that the composite material may be used in other applications.

The invention may, for example be used in imprint lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a support constructed to support a patterning device, the patterning device being capable of imparting a radiation beam with a pattern in its cross-section to form a patterned radiation beam;
   a substrate table constructed to hold a substrate; and
   a projection system configured to project the patterned radiation beam onto a target portion of the substrate,
   wherein a component of the lithographic apparatus comprises a composite material, the composite material including a layer of carbon fiber and a layer of titanium, and
   wherein the component is the substrate table or the support.

2. The lithographic apparatus according to claim 1, wherein layers of titanium and carbon fibers are alternatively arranged within the composite material.

3. The lithographic apparatus according to claim 1, wherein the titanium layer has a thickness between about 0.05 and 0.6 mm.

4. The lithographic apparatus according to claim 3, wherein the titanium layer has a thickness between about 0.2 and 0.4 mm.

5. The lithographic apparatus according to claim 1, wherein the component includes an inside corner and the composite material is provided on the inside corner.

6. The lithographic apparatus according to claim 5, wherein the layer of titanium is a plate of titanium with a corner shape arranged in the inside corner.

7. The lithographic apparatus according to claim 1, wherein the component is moveable and includes an inside corner and the composite material is provided on the inside corner.

8. The lithographic apparatus according to claim 7, wherein the component includes a frame and an arm extending from said frame, said inside corner defined at the junction of said arm and said frame.

9. The lithographic apparatus according to claim 1, wherein the substrate table or the support has a surface for receiving, respectively, the substrate or the patterning device.

10. The lithographic apparatus according to claim 1, wherein the layer of titanium is smaller than the layer of carbon fiber.

11. A lithographic apparatus comprising:
    a support constructed to support a patterning device, the patterning device being capable of imparting a radiation beam with a pattern in its cross-section to form a patterned radiation beam;
    a substrate table constructed to hold a substrate; and
    a projection system configured to project the patterned radiation beam onto a target portion of the substrate,
    wherein a component of the lithographic apparatus comprises a composite material, the composite material including a layer of carbon fiber and a layer of titanium, and
    wherein the composite material is provided on an inside corner of the component and the layer of titanium is a plate of titanium with a corner shape arranged in the inside corner.

12. A lithographic apparatus, comprising:
    a support constructed to support a patterning device, the patterning device being capable of imparting a radiation beam with a pattern in its cross-section to form a patterned radiation beam;
    a substrate table constructed to hold a substrate;
    a projection system configured to project the patterned radiation beam onto a target portion of the substrate, and
    a crash protector that is configured to protect the apparatus from a moveable part, wherein the crash protector comprises a composite material, the composite material including a layer of carbon fiber and a layer of titanium.

13. The lithographic apparatus according to claim 12, wherein the crash protector is arranged around the substrate table or the support.

14. The lithographic apparatus according to claim 13, wherein the crash protector has a frame arranged around the substrate table or the support and an arm extending away from said frame.

15. The lithographic apparatus according to claim 14, wherein the composite material is provided at an inside corner defined at the junction of the arm and the frame.

16. A lithographic apparatus, comprising:
    a support constructed to support a patterning device, the patterning device being capable of imparting a radiation beam with a pattern in its cross-section to form a patterned radiation beam;
    a substrate table constructed to hold a substrate;
    a projection system configured to project the patterned radiation beam onto a target portion of the substrate, and
    a positioning device configured to position the support or the substrate table, wherein the positioning device comprises a composite material, the composite material including a layer of carbon fiber and a layer of titanium.

17. An object support of a lithographic apparatus, the object support configured to support an object in the lithographic apparatus and comprising a composite material comprising a layer of a carbon fiber, wherein a layer of titanium is provided within the composite material, and wherein the object support is a substrate table configured to support a substrate or a support configured to support a patterning device of the lithographic apparatus.

18. The object support according to claim 17, wherein layers of titanium and carbon fibers are alternatively arranged within the composite material.

19. The object support according to claim 17, wherein the composite material is provided on an inside corner of the object support.

20. A component of a lithographic apparatus comprising a composite material comprising a layer of a carbon fiber, wherein a layer of titanium is provided within the composite material, wherein the component is a movable part of the lithographic apparatus, wherein the composite material is provided on an inside corner of the component, and wherein the layer of titanium is a plate of titanium with a corner shape provided on the inside of the corner.

* * * * *

UNITED STATES PATENT AND TRADEMARK OFFICE
CERTIFICATE OF CORRECTION

PATENT NO. : 8,848,169 B2  
APPLICATION NO. : 12/466931  
DATED : September 30, 2014  
INVENTOR(S) : Mark Scholten et al.

Page 1 of 1

It is certified that error appears in the above-identified patent and that said Letters Patent is hereby corrected as shown below:

On title page, item (75) Inventors, Line 2
replace "Winteire (NL)"
with --Wintelre (NL)--.

Signed and Sealed this
Third Day of February, 2015

Michelle K. Lee
*Deputy Director of the United States Patent and Trademark Office*